US010827582B2

(12) United States Patent
Mao et al.

(10) Patent No.: US 10,827,582 B2
(45) Date of Patent: Nov. 3, 2020

(54) ELECTRONIC DEVICE FOR DISPLAYING IMAGE COMPRISING FIRST AND SECOND LEDS, FIRST TFT, AND ONE OF NON-SELF-LUMINOUS DISPLAY OR LIGHT EMITTING CONTROL UNIT

(71) Applicant: InnoLux Corporation, Miao-Li County (TW)

(72) Inventors: Li-Wei Mao, Miao-Li County (TW); Chin-Lung Ting, Miao-Li County (TW); Ming-Chun Tseng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/151,350

(22) Filed: Oct. 4, 2018

(65) Prior Publication Data
US 2019/0191504 A1 Jun. 20, 2019

(30) Foreign Application Priority Data
Dec. 18, 2017 (CN) .......................... 2017 1 1366392

(51) Int. Cl.
| *H05B 45/37* | (2020.01) |
| *H01L 27/12* | (2006.01) |
| *G09G 3/32* | (2016.01) |
| *H01L 33/52* | (2010.01) |
| *H01L 33/62* | (2010.01) |
| *H01L 27/32* | (2006.01) |
| *H01L 25/075* | (2006.01) |

(52) U.S. Cl.
CPC ............... *H05B 45/37* (2020.01); *G09G 3/32* (2013.01); *H01L 27/1214* (2013.01); *H01L 27/3204* (2013.01); *H01L 33/52* (2013.01); *H01L 33/62* (2013.01); *H01L 25/0753* (2013.01)

(58) Field of Classification Search
CPC ............... H01L 27/3204; H01L 27/156; H01L 27/1214; H01L 27/3209; H01L 29/42384; H01L 33/62; H01L 33/52; H01L 25/0753; H05B 45/37; G09G 3/32; H01S 5/4018
See application file for complete search history.

(56) References Cited

U.S. PATENT DOCUMENTS

| 10,468,394 B1* | 11/2019 | Xi |
| 10,559,256 B2* | 2/2020 | Lee |
| 2007/0147075 A1 | 6/2007 | Bang |
| 2007/0195044 A1 | 8/2007 | Uemoto |
| 2008/0122760 A1* | 5/2008 | Levey .................. G09G 3/3233 345/78 |
| 2008/0246040 A1 | 10/2008 | Sakai |
| 2010/0277092 A1 | 11/2010 | Menegazzi |
| 2010/0277403 A1 | 11/2010 | Chao |
| 2011/0037054 A1* | 2/2011 | Shieh .................. H01L 27/3204 257/40 |

(Continued)

Primary Examiner — Borna Alaeddini
(74) Attorney, Agent, or Firm — Winston Hsu

(57) ABSTRACT

The present disclosure provides an electronic device including a light-emitting unit and at least one circuit unit. The light-emitting unit includes at least two diodes coupled in series. At least one of the diodes is a light-emitting diode for generating light. The circuit unit includes a thin-film transistor or switch component coupled to a first end of the light-emitting unit and a power source.

12 Claims, 8 Drawing Sheets

(56) References Cited

U.S. PATENT DOCUMENTS

| | | | |
|---|---|---|---|
| 2011/0096059 A1* | 4/2011 | Ohhashi | G09G 3/3233 |
| | | | 345/212 |
| 2011/0148288 A1* | 6/2011 | Chen | |
| 2012/0182497 A1* | 7/2012 | Qi | G02B 6/0021 |
| | | | 349/62 |
| 2014/0313455 A1* | 10/2014 | Nam | G02F 1/133526 |
| | | | 349/62 |
| 2014/0362062 A1 | 12/2014 | Limketkai | |
| 2015/0362950 A1* | 12/2015 | Chang | G06F 1/1637 |
| | | | 362/97.1 |
| 2019/0208175 A1* | 7/2019 | Chang | H04N 13/307 |

* cited by examiner

ELECTRONIC DEVICE FOR DISPLAYING IMAGE COMPRISING FIRST AND SECOND LEDS, FIRST TFT, AND ONE OF NON-SELF-LUMINOUS DISPLAY OR LIGHT EMITTING CONTROL UNIT

CROSS REFERENCE TO RELATED APPLICATION

The present application claims the priority benefit of China application serial no. 201711366392.3, filed on Dec. 18, 2017. The entirety of the above-mentioned patent application is hereby incorporated by reference herein.

BACKGROUND OF THE DISCLOSURE

1. Field of the Disclosure

The present disclosure relates to an electronic device, and more particularly, to a light-emitting electronic device having diodes coupled in series.

2. Description of the Prior Art

Light-emitting diode (LED) is widely applied to lighting systems and display devices in human regular life because of having small size, high efficiency, low consumption, long lifetime, fast response speed, high color rendering and no mercury that pollutes environment. In the display electronic device, LED has replaced traditional cathode ray tube to serve as a light source of backlight. Besides, as the continued advancement of manufacturing process for the LED, the size of the LED becomes smaller, so that the LED can serve as a pixel unit of the display electronic device, such as a mini-LED with a size ranged from 100 μm to 300 μm, or a micro-LED ranged from 1 μm to 100 μm. In general, the small sized LED is a current driving component, driving current of which requires several mini-amperes, so the conventional method for driving single small sized LED is to utilize a driving circuit with one or more built-in transistors so as to have enough driving current. However, since the proportion of power of the transistors in the driving circuit is relatively high, how to increase the proportion of power of whole LEDs is still an issue to improve.

SUMMARY OF THE DISCLOSURE

One of the objectives of the present disclosure is to provide an electronic device to increase the proportion of power of light-emitting unit.

An embodiment of the present disclosure provides an electronic device including a light-emitting unit and at least one circuit unit. The light-emitting unit includes at least two diodes coupled in series. At least one of the diodes is a light-emitting diode for generating light. The circuit unit includes a first thin-film transistor coupled to a first end of the light-emitting unit and a power source respectively.

In the electronic device of the present disclosure, the proportion of power of the light-emitting diodes in addition to the lifetime of thin-film transistors or switch components in the driving unit can be increased by the design of coupling light-emitting diodes with smaller size in series. Besides, since the light-emitting diodes used in the light-emitting unit have smaller size, the light-emitting unit may further generate light with higher brightness.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, certain elements in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". It will be understood that when a component is referred to as being "coupled" to another component (or its variant), it can be directly connected to the another component, or indirectly connected (e.g. electrically connected) to the another component through one or more components.

It should be noted that the technical features in different embodiments described in the following can be replaced, recombined, or mixed with one another to constitute another embodiment without departing from the spirit of the present disclosure.

Figure 1:
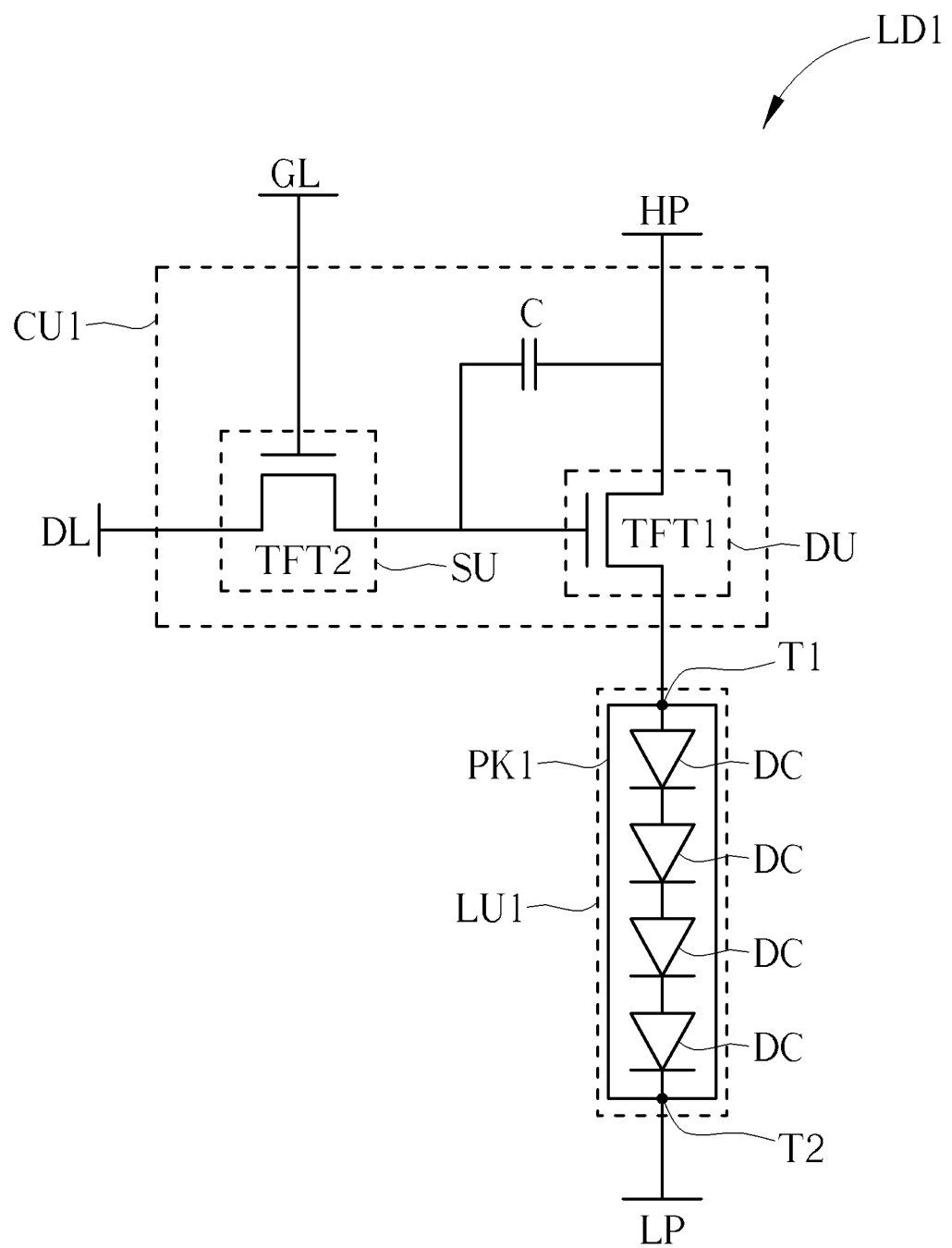
FIG. 1 depicts a schematic circuit diagram of an electronic device according to a first embodiment of the present disclosure.

Refer to FIG. 1 which depicts a schematic circuit diagram of an electronic device (the electronic device is a light-emitting device in this embodiment and may be display device or light detecting device in other embodiments) according to a first embodiment of the present disclosure. As shown in FIG. 1, the electronic device LD1 may include a light-emitting unit LU1 and at least one circuit unit CU1. The light-emitting unit LU1 may refer to as light-emitting diode chip or light-emitting diode unit with more complicate package. The light-emitting unit LU1 includes at least two diodes DC (diode die) coupled in series. Each diode DC has an anode and a cathode, in which the anode of one of the diodes DC is coupled to the cathode of another one of the diodes DC. The light-emitting unit LU1 may has a first end T1 and a second end T2. In this embodiment, the first end T1 is coupled to the anode of the serial diodes DC that is not coupled to the cathodes, and the second end T2 is coupled to the cathode of the serial diodes DC that is not coupled to the anodes. In other embodiments, the first end T1 is coupled to the cathode of the serial diodes that is not coupled to the anodes, and the second end T2 is coupled to the anode of the serial diodes that is not coupled to the cathodes. In this embodiment, the first end T1 of the light-emitting unit LU1 is coupled to a second end of the circuit unit CU1, and the second end T2 of the light-emitting unit LU1 is coupled to the low power source LP. Also, a first end of the circuit unit CU1 is coupled to a high power source HP. In other embodiment, the first end T1 of the light-emitting unit LU1 is coupled to the high power source HP, the second end T2 of the light-emitting unit LU1 is coupled to the first end of the circuit unit CU1, and a second end of the circuit unit CU1 is coupled to the low power source LP.

Additionally, at least one of the diodes DC is a light-emitting diode for generating light. In this embodiment, all of the diodes DC are the light-emitting diodes. In other embodiments, the diodes DC may be a combination of light-emitting diode and non-light-emitting diode with other function (e.g., sensor or rectifier). The light-emitting diode may be for example inorganic light-emitting diode or organic light-emitting diode. According to required application of the electronic device LD1, the inorganic light-emitting diode may be a micro-LED with size ranged from 1 μm to 100 μm, a mini-LED with size ranged from 100 μm to 300 μm, or an LED with size ranged from 300 μm to 2 μm for example. The diodes DC of the present disclosure coupled in series are not limited to be light-emitting diodes. In another embodiment, at least one of the diodes DC coupled in series may be other non-light-emitting diode. In another embodiment, the light-emitting unit LU1 may also include at least one diode coupled in parallel to one of the aforementioned diodes, or coupled in parallel to the aforementioned serial diodes DC, but the present disclosure is not limited thereto. The purpose of the present disclosure is mainly to increase the proportion of power of the light-emitting unit LU1, so any circuit design with the diodes DC coupled in series or in parallel that is capable of achieving this effect can be applied to the present disclosure.

The circuit unit CU1 is coupled to the light-emitting unit LU1 and used for driving the light-emitting unit LU1 to generate light, in which an end (first end or second end) of the circuit unit CU1 is coupled to one of the first end T1 and the second end T2 of the light-emitting unit LU1 and a power source respectively. In this embodiment, the circuit unit CU1 may include a driving unit DU and a switch unit SU, in which the switch unit SU is used for controlling the switch of the driving unit DU. For example, in this embodiment, the driving unit DU may include at least one first thin-film transistor TFT1 disposed on substrate by photolithography process, and a source and a drain of the first thin-film transistor TFT1 are coupled to the first end T1 and a high power source HP respectively. In other embodiments, the first thin-film transistor TFT1 may include at least one switch component that can be a metal oxide semiconductor (MOS) transistor or other transistor types of switch component other than thin-film transistor (e.g., IC, driver), and the first thin-film transistor TFT1 may be replaced by the switch component. The first thin-film transistor for example has an active layer, and a material of the active layer includes at least one of low temperature polysilicon semiconductor, amorphous semiconductor and metal oxide semiconductor. The high power source HP may be a DC voltage source with high voltage level, and the low power source LP may have a ground level or a common voltage level for example, but the present disclosure is not limited thereto. The switch unit SU may include at least one transistor. The transistor of the switch unit SU in this embodiment may include a second thin-film transistor TFT2 disposed on substrate by photolithography process, in which a gate, a source and a drain of the second thin-film transistor TFT2 may be coupled to a switch signal source, a gate of the first thin-film transistor TFT1 and a data signal source. Further, the circuit unit CU1 may further include a capacitor C coupled to a drain and the gate of the first thin-film transistor TFT1 respectively, and the capacitor C maintain the voltage between the drain and the gate of the first thin-film transistor TFT1 while the second thin-film transistor TFT2 is turned off. The electronic device LD1 serves as a sub-pixel of a display panel is taken as an example, in which in the thin-film transistor TFT2, the gate may be coupled to the switch signal source through a gate line GL, and the drain is coupled to the data signal source through a data line DL, but not limited thereto. In a variant embodiment, the source and the drain of the thin-film transistor may be exchanged. In other embodiments, the second thin-film transistor TFT2 may be replaced by a metal oxide semiconductor (MOS) transistor or other transistor types of switch component other than thin-film transistor.

The operation and effect of the present disclosure is further detailed in the following description and compared to the traditional electronic device using single light-emitting diode. It should be noted that the light-emitting diode is a current driving component, so the voltage drops, each of which is between two ends of each light-emitting diode, are designed to be substantially identical. For this reason, a voltage drop of single light-emitting diode is less than a voltage drop of each of the plurality of light-emitting diodes coupled in series. Also, when the power consumption of the single light-emitting diode and the power consumption of the light-emitting diodes coupled in series are identical, a size of the single light-emitting diode requires to be greater than a size of one of the plurality of light-emitting diodes, in which the driving current of the single light-emitting diode is greater than the driving current of the plurality of the light-emitting diodes. Since the voltage drop of the plurality of the light-emitting diodes coupled in series is greater than that of the single light-emitting diode, a proportion of the power consumption of the plurality of light-emitting diodes coupled in series to the total power consumption of the electronic device LD1 with the plurality of light-emitting diodes is higher than a proportion of the power consumption of the single light-emitting diode to the power consumption of the electronic device with single light-emitting diode; i.e., a power consumption of the light-emitting unit LU1 utilizing a plurality of light-emitting diodes with smaller size coupled in series to generate light has higher proportion in whole electronic device LD1 compared to the light-emitting unit utilizing single light-emitting diode with larger size to generate light. Thus, the proportion of the power consumption of the electronic device LD1 used in the light-emitting unit LU1 can be increased. Accordingly, the proportion of power of at least two light-emitting diodes coupled in series with smaller size in the electronic device LD1 of this embodiment can be greater than the proportion of power of the single light-emitting diode with larger size in the traditional electronic device. Besides, since the driving current of the light-emitting diodes coupled in series is lower than the driving current of the single light-emitting diode, which means the turn-on current of the first thin-film transistor TFT1 (or switch component) for driving the light-emitting unit LU1 is lower than the turn-on current of the traditional thin-film transistor (or switch component) for driving the single light-emitting diode, the load of the first thin-film transistor TFT1 (or switch component) of this embodiment can be lower than the load of the traditional thin-film transistor (or switch component). In other words, the design of the light-emitting unit LU1 of this embodiment can prolong the lifetime of the first thin-film transistor TFT1 (or switch component). For example, the voltage drop of the light-emitting diode is 2V. When the driving current of the light-emitting diode of the traditional electronic device is 20 mA, the power of the light-emitting unit of the traditional electronic device is 40 mW. When the voltage drop between the drain and the source of the thin-film transistor (or switch component) for driving is 8V, the voltage drop between the high power source and the lower power source is 10V, and therefore, the proportion of the power consumption of the light-emitting unit of the traditional electronic device (2×20 mW) to the power consumption of the traditional electronic device (10×20 mW) is ⅕. However, when the driving current of each of the light-emitting diodes in this embodiment is reduced to be 5 mA, and the voltage drop of two ends of each light-emitting diode is 2V, the light-emitting unit LU1 of this embodiment requires four light-emitting diodes coupled in series to have the voltage drop of 8V in the same power consumption situation as the traditional total power consumption (that is 40 mW). In the situation that the voltage drop between the drain and the source of the first thin-film transistor TFT1 (or switch component) is also 8V, the voltage drop between the high power source HP and the low power source LP is 16V, so a proportion of the power consumption of the light-emitting unit LU1 (5×8 mW) to the power consumption of the electronic device LD1 (5×16 mW) can be increased to be ½. Additionally, since the driving current for driving the light-emitting diodes is reduced to be 5 mA in this embodiment, the voltage drop between the drain and the source of the first thin-film transistor TFT1 (or switch component) may be reduced to be 4V. Accordingly, the voltage drop between the high power source HP and the low power source LP is 12V. Although the voltage drop between the high power source HP and the low power source LP requires to be increased, the proportion of the power consumption of the light-emitting unit LU1 (5×8 mW) to the power consumption of the electronic device LD1 (5×12 mW) can be significantly increased to be ¾. Furthermore, since the driving current falls to be 5 mA, the turn-on current of the first thin-film transistor TFT1 can also be lowered, and accordingly, the load of the first thin-film transistor TFT1 (or switch component) for driving the light-emitting diodes is mitigated. For this reason, heat generated from the operation of the first thin-film transistor TFT1 (or switch component) can be lowered to rise the lifetime of the first thin-film transistor TFT1. In other words, through coupling a plurality of light-emitting diodes with smaller size in series, not only the electronic device LD1 of this embodiment can have higher power conversion efficiency and higher proportion of power, but also the lifetime of the first thin-film transistor TFT1 (or switch component) in the driving unit SU for driving the light-emitting unit LU1 can be effectively improved. When the electronic device LD1 serves as a pixel or a sub-pixel of the display panel, the driving unit DU of the present disclosure is not limited to be composed of single first thin-film transistor TFT1 (or switch component) and may include a plurality of thin-film transistors (or a plurality of switch components), and hence, the design of coupling the light-emitting diodes with smaller size in series can not only lower the load of the single thin-film transistor (or switch component) but also lower the loads of the thin-film transistors (or switch components). In another embodiment, the circuit unit CU1 may further include three thin-film transistors or four thin-film transistors (or switch components). In this embodiment, the electronic device LD1 may be used for displaying image alone, and the light-emitting unit LU1 of which may be pixel or sub-pixel for displaying images directly. In another embodiment, the electronic device LD1 may be used as a backlight source of the display panel.

Figure 2:
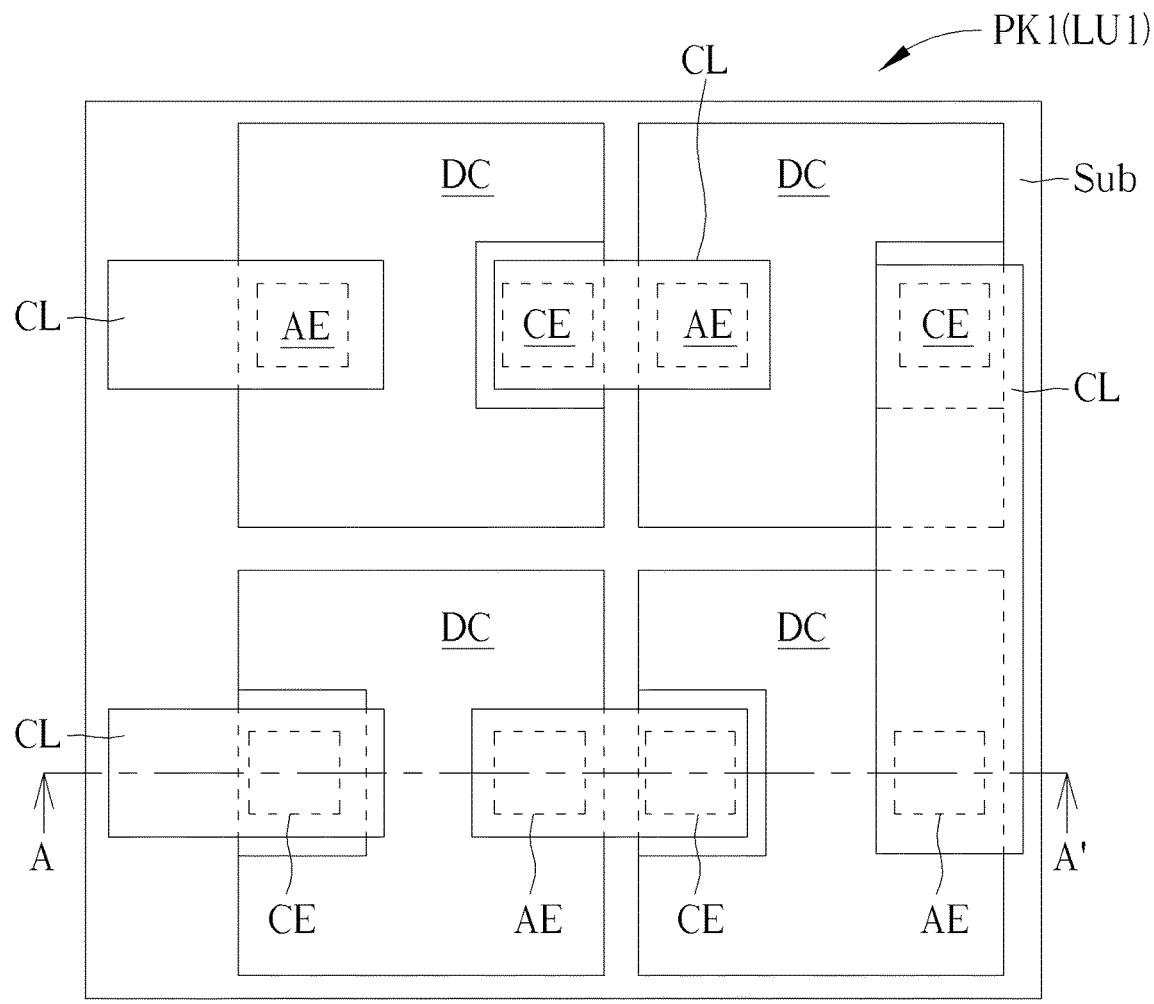
FIG. 2 schematically illustrates a top view of the light-emitting unit according to the first embodiment of the present disclosure.
Figure 3:
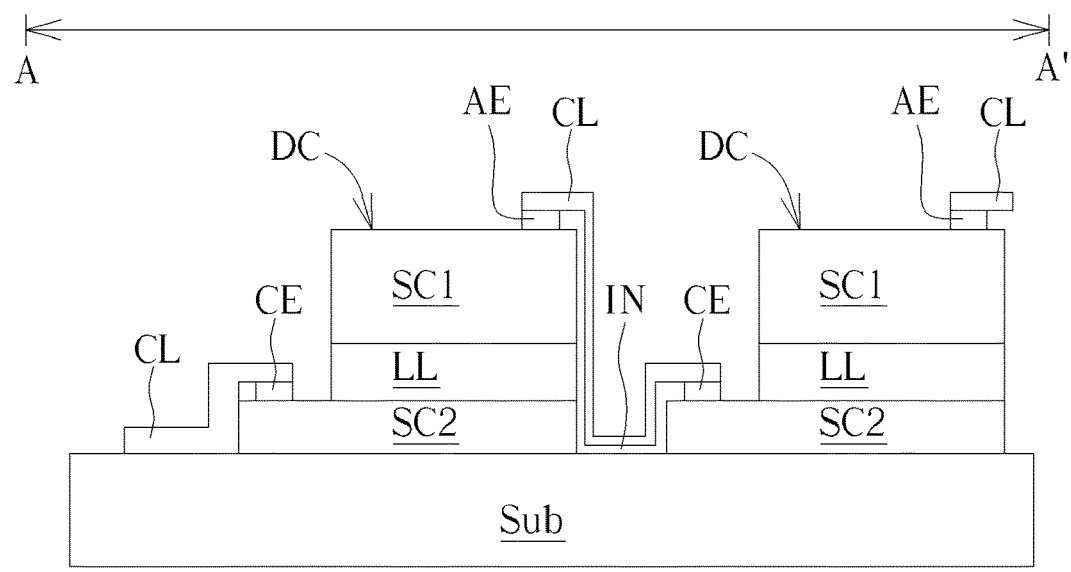
FIG. 3 schematically illustrates a cross-sectional view of the light-emitting unit of FIG. 2 taken along a line A-A'.

Refer to FIG. 2 and FIG. 3, in which FIG. 2 schematically illustrates a top view of the light-emitting unit according to the first embodiment of the present disclosure, and FIG. 3 schematically illustrates a cross-sectional view of the light-emitting unit of FIG. 2 taken along a line A-A'. As shown in FIG. 2 and FIG. 3, the light-emitting unit LU1 of this embodiment includes a package PK1, and the diodes DC are disposed in (enclosed within) the package PK1. In this embodiment, since each diode DC is the light-emitting diode, each diode DC may, for example but not limited to, include a n-type semiconductor layer SC2, a light-emitting layer LL disposed on the n-type semiconductor layer SC2 and a p-type semiconductor layer SC1 disposed on the light-emitting layer LL. Each diode DC may have an anode AE and a cathode CE. The package PK1 may further include a base substrate Sub, connecting lines CL and insulation layer IN. For example, the light-emitting unit LU1 includes four diodes DC, in which the diodes DC are arranged in an array formation on the base substrate Sub and be separated from each other, parts of the connecting lines CL are coupled to the anodes and the cathodes of the diodes DC adjacent to each other to serially couple to the diodes DC in the same package PK1, and the connecting lines CL coupled to two ends of the serial diodes can be regarded as the first end T1 and the second end T2 of the light-emitting unit LU1 or may be coupled to the outer conductive pins that form the first end T1 and the second end T2 of the light-emitting unit LU1. The insulation layer IN may be disposed to the connecting lines CL and the diodes DC respectively. The material of base substrate Sub may be glass, glass fiber, plastic, silicon wafer, or aluminum oxide.

It is noted that since the refractive index of the material for fabricating the light-emitting diode, such as 2.5, is greater than the refractive index outside, the p-type semiconductor layer SC1 and the n-type semiconductor layer SC2 easily form an optical waveguide structure, which reduces light to leak out from the top surface of the n-type semiconductor layer SC2 and causes light easily to emit out from the edge of the light-emitting layer LL. Thus, when the total exposed edge length of the light-emitting diode is longer, the amount of leaked light is greater. In this embodiment, because the light-emitting diodes DC in the light-emitting unit LU1 have smaller size, the light-emitting diodes DC have longer total edge length than the single light-emitting diode with larger size. Thus, under the same power consumption, the light-emitting unit LU1 of this embodiment has higher leaked light so as to generate light with higher brightness. For example, a length of an edge of the traditional rectangular light-emitting diode is 100 μm, the power consumption of which per unit area is $(2\times20)/(100\times100)=1/250$ mW/μm$^2$, and a total edge length of which is 400 μm. Under the same power consumption per unit area, a length of an edge of each light-emitting diode should be 50 μm, and the total edge length should be $(4\times50)\times4=800$ μm, so that the light-emitting unit LU1 of this embodiment can generate greater brightness than that of the traditional light-emitting unit.

The electronic device of the present disclosure is not limited to the aforementioned embodiment, and may have other different variant embodiments or embodiments. To simplify the description and make it easier to compare the difference between the first embodiment and other embodiments, the identical components in each of the following embodiments are marked with identical symbols as the first embodiment, and the following description will detail the dissimilarities among different embodiments and the identical features will not be redundantly described.

Figure 4:
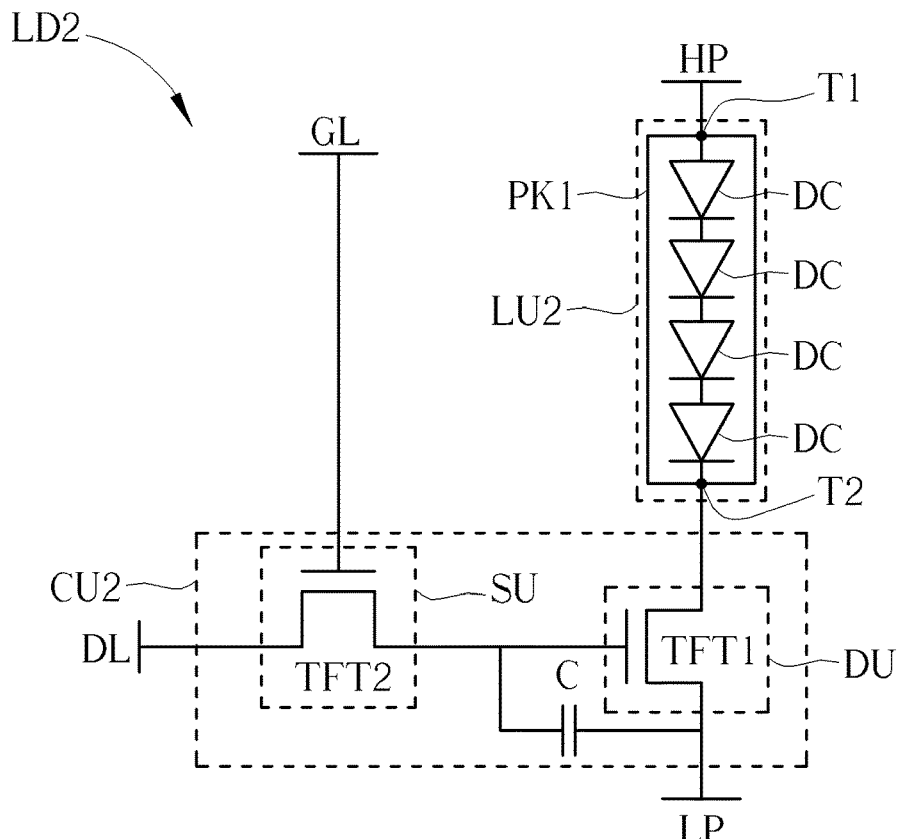
FIG. 4 depicts a schematic circuit diagram of an electronic device according to a second embodiment of the present disclosure.

Refer to FIG. 4 which depicts a schematic circuit diagram of an electronic device according to a second embodiment of the present disclosure. As shown in FIG. 4, in the light-emitting unit LU2 of the electronic device LD2 provided by this embodiment, the first end T1 (anode) is coupled to the high power source HP, and the second end T2 is coupled to an end of the circuit unit CU2 as compared with the first embodiment. Also, another end of the circuit unit CU2 is coupled to the low power source LP. Specifically, the drain and the source of the first thin-film transistor TFT1 (or the switch component) of the circuit unit CU2 are coupled to the second end T2 of the light-emitting unit LU2 and the low power source LP respectively. Further, the capacitor C is coupled to the gate and the source of the first thin-film transistor TFT1 (or the switch component) respectively.

Figure 5:
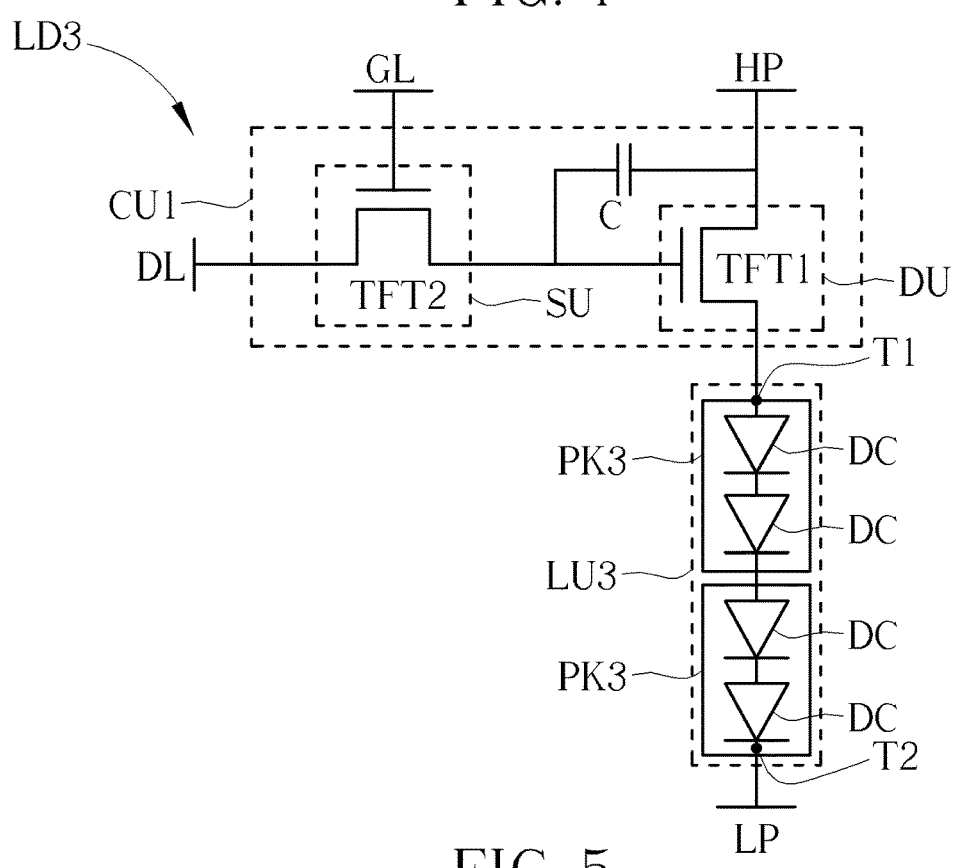
FIG. 5 depicts a schematic circuit diagram of an electronic device according to a third embodiment of the present disclosure.
Figure 6:
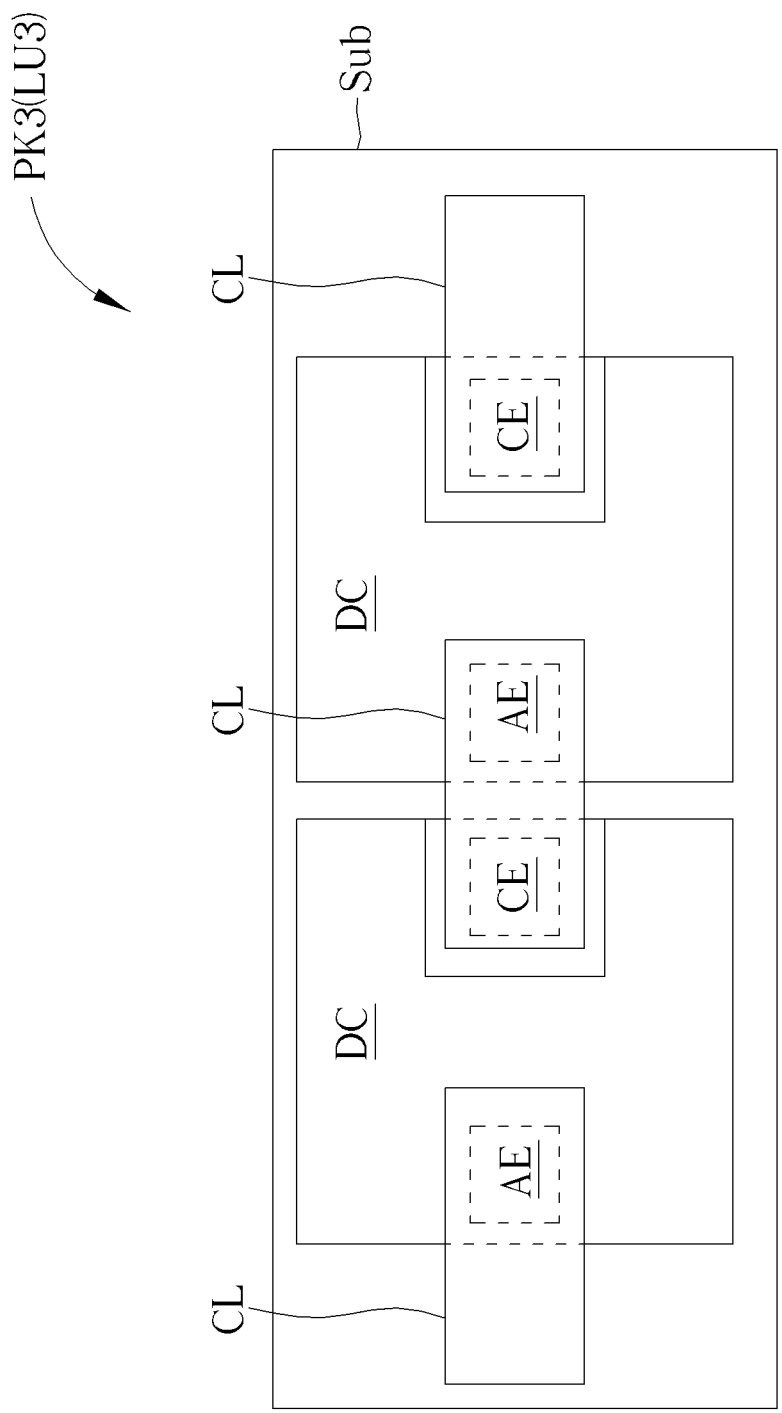
FIG. 6 schematically illustrates a top view of a single package according to the third embodiment of the present disclosure.

Refer to FIG. 5 and FIG. 6, in which FIG. 5 depicts a schematic circuit diagram of an electronic device according to a third embodiment of the present disclosure, and FIG. 6 schematically illustrates a top view of a single package according to the third embodiment of the present disclosure. As shown in FIG. 5 and FIG. 6, the diodes DC of the electronic device LD3 provided by this embodiment may be disposed in (enclosed within) at least two packages PK3 respectively as compared with the first embodiment. In this embodiment, the light-emitting unit LU3 may include at least four diodes DC, and the light-emitting unit LU3 may include at least two packages PK3, in which at least two of the diodes DC are disposed in (enclosed within) one of the packages PK3, and at least another two of the diodes DC are disposed in (enclosed within) another one of the packages PK3. For example, each package PK3 includes a base substrate Sub and connecting lines CL, and the connecting lines CL are used for coupling the light-emitting diodes DC in series. Also, the packages PK3 may be serially coupled after being disposed on array substrate of display panel or circuit board of backlight module. In another embodiment, the light-emitting unit LU3 and the circuit unit CU1 of the electronic device LD3 may adopt the connection method of the above second embodiment.

Figure 7:
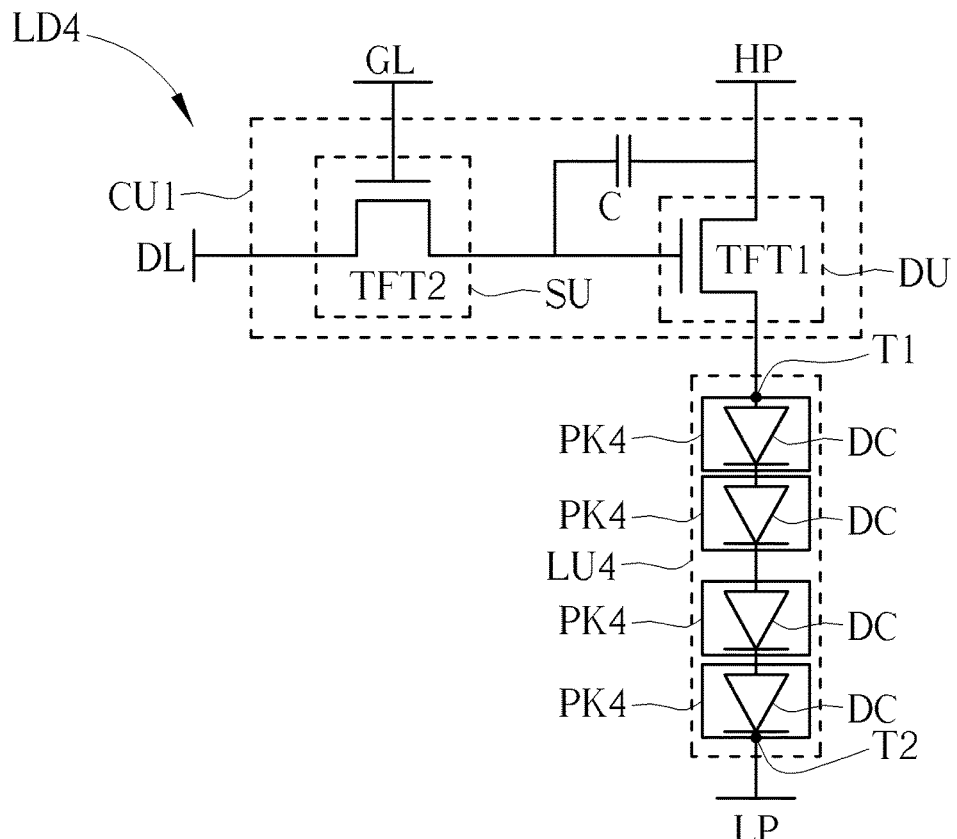
FIG. 7 depicts a schematic circuit diagram of an electronic device according to a fourth embodiment of the present disclosure.
Figure 8:
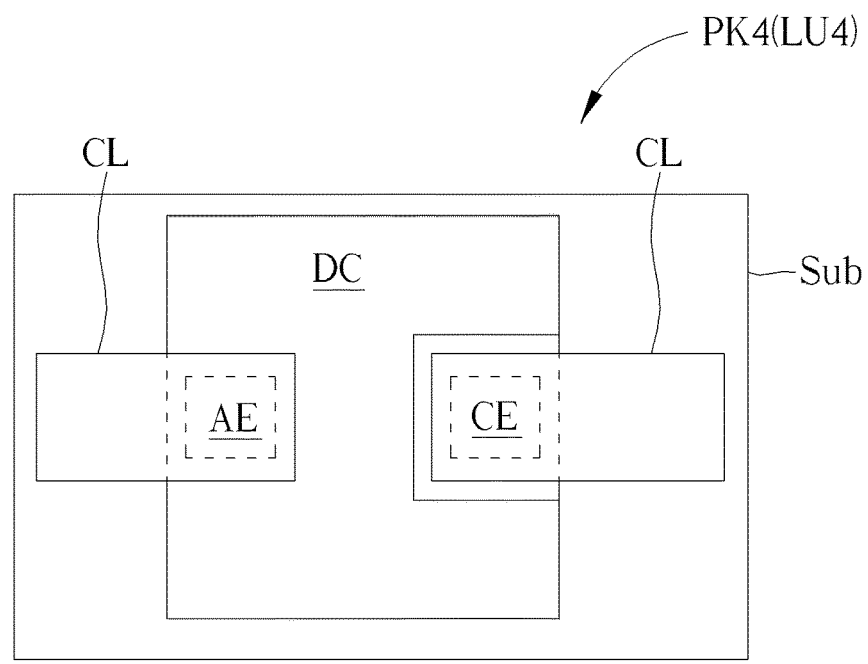
FIG. 8 schematically illustrates a top view of a single package according to the fourth embodiment of the present disclosure.

Refer to FIG. 7 and FIG. 8, in which FIG. 7 depicts a schematic circuit diagram of an electronic device according to a fourth embodiment of the present disclosure, FIG. 8 schematically illustrates a top view of a single package according to the fourth embodiment of the present disclosure. As shown in FIG. 7 and FIG. 8, each of the diodes DC of the electronic device LD4 provided by this embodiment may be disposed in (enclosed within) one corresponding package PK4 as compared with the first embodiment. The light-emitting unit LU4 includes four diodes DC is taken as an example, in which the light-emitting unit LU4 includes four packages PK4, each of which includes a base substrate Sub and connecting lines CL, and the connecting lines CL are coupled to the anodes AE and the cathodes CE of the light-emitting diodes DC respectively. Also, the packages PK4 may be serially coupled after being disposed on array substrate of display panel or circuit board of backlight module. In another embodiment, the light-emitting unit LU4 and the circuit unit CU1 of the electronic device LD4 may adopt the connection method of the above second embodiment.

Figure 9:
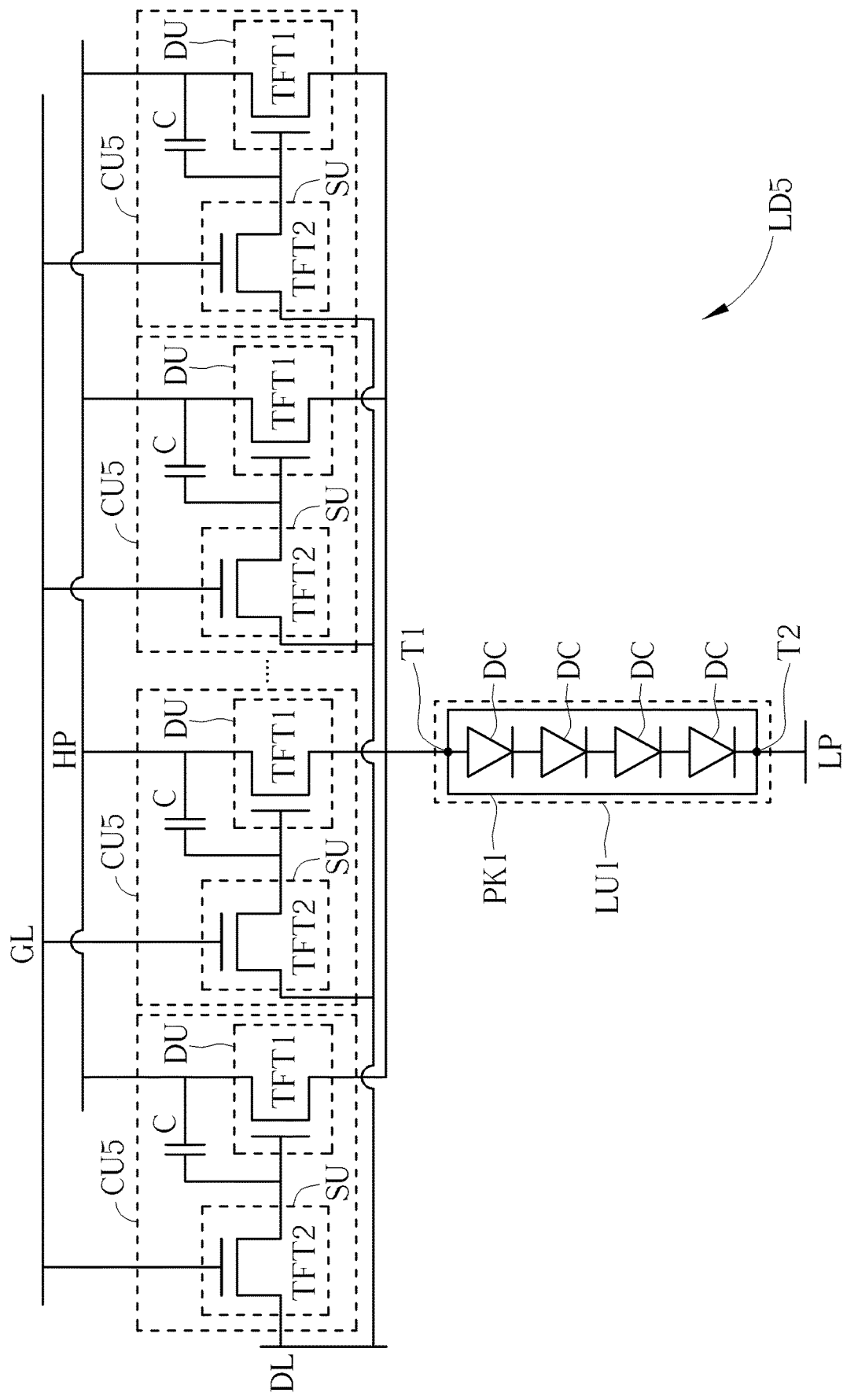
FIG. 9 depicts a schematic circuit diagram of an electronic device according to a fifth embodiment of the present disclosure.

Refer to FIG. 9 which depicts a schematic circuit diagram of an electronic device according to a fifth embodiment of the present disclosure. As shown in FIG. 9, in this embodiment, the electronic device LD5 includes a plurality of circuit unit CU5 coupled in parallel, and the circuit units CU5 are coupled to an end of the light-emitting unit LU1, as compared with the first embodiment. In this embodiment, each circuit unit CU5 is coupled to the first end T1 (anode) of the light-emitting unit LU1 and the high power source HP respectively, and each circuit unit CU5 may for example the same as the circuit unit of the first embodiment, but not limited thereto. It is noted that the turn-on current of the thin-film transistor (or switch component) for driving the light-emitting diodes is the driving current of each light-emitting diode, and the thin-film transistor (or the switch component) is operated in the saturation region, so when the driving current for driving the light-emitting diodes is be greater than the turn-on current of the first thin-film transistor TFT1 (or switch component) of single circuit unit CU5, the driving current for driving the light-emitting diodes can be increased by coupling a plurality of circuit units CU5 in parallel in this embodiment. For example, since the brightness of the backlight source is greater than a brightness of single pixel or single subpixel, the light-emitting diodes in the light-emitting unit LU1 requires higher driving current. Through coupling the circuit units CU5 in parallel, the light-emitting diodes can generate light with required brightness. For example, the number of the circuit units CU5 may be substantially 100 to 200, but not limited thereto, and the number of the circuit units CU5 may be mainly determined by the driving current of the light-emitting unit LU1. It is noted that since the light-emitting unit LU1 of this embodiment includes a plurality of diodes DC coupled in series, under condition of the same power consumption per unit area, the driving circuit of the diode DC can be reduced, thereby lowering the number of the circuit units CU5 of the light-emitting unit LU1. In another embodiment, the light-emitting unit LU1 and the circuit units CU5 of the electronic device LD5 may adopt the connection method of the above second embodiment; that is to say, each circuit unit CU5 may be coupled to the second end T2 (cathode) of the light-emitting unit LU1 and the low power source LP respectively.

Figure 10:
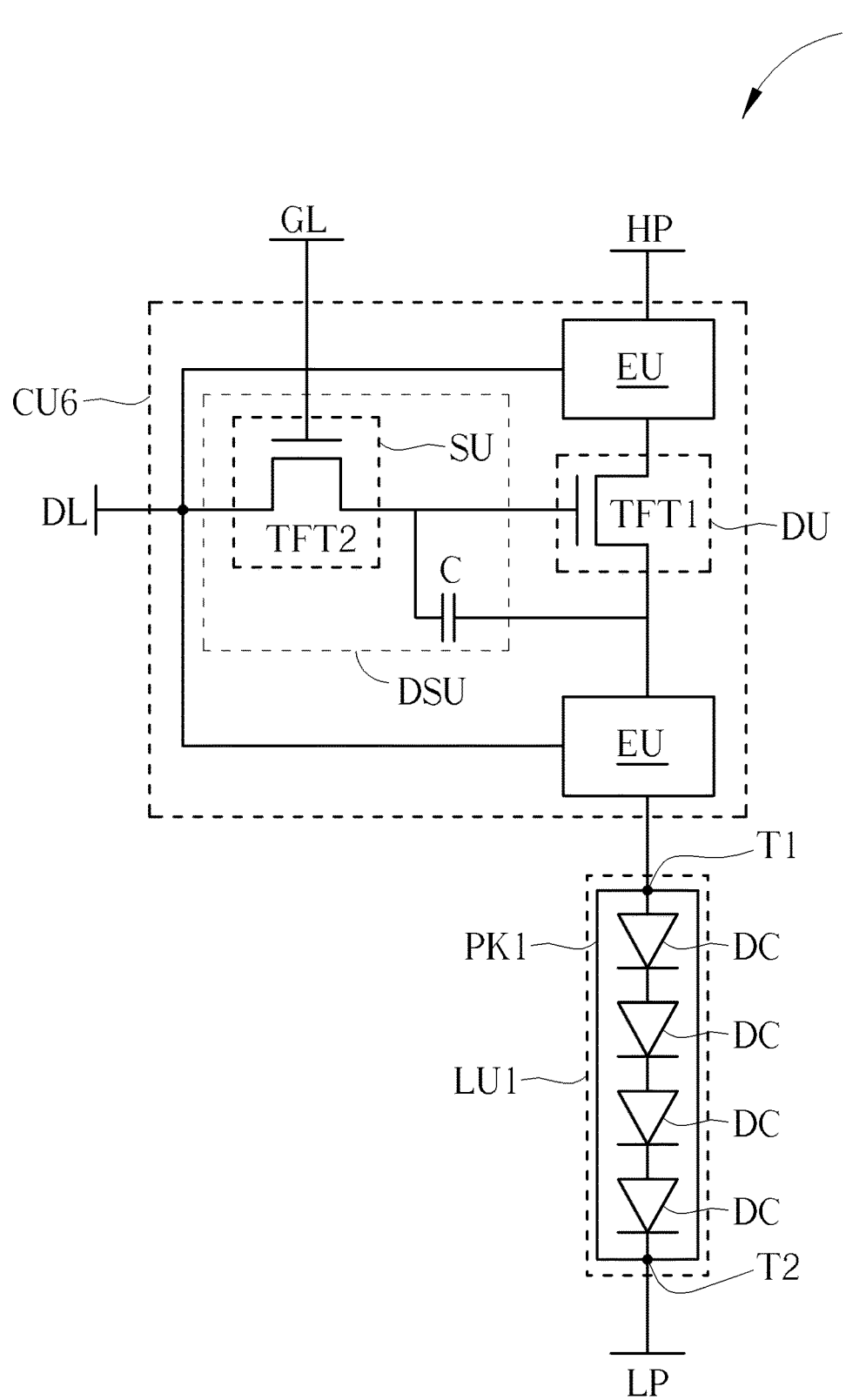
FIG. 10 depicts a schematic circuit diagram of an electronic device according to a sixth embodiment of the present disclosure.

Refer to FIG. 10 which depicts a schematic circuit diagram of an electronic device according to a sixth embodiment of the present disclosure. As shown in FIG. 10, the circuit unit CU6 of the electronic device LD6 provided by this embodiment may further include at least one light-emitting control unit as compared with the first embodiment. In this embodiment, the circuit unit CU6 may include a data program storage unit DSU which includes a switch unit SU and a capacitor C. The circuit unit CU6 may include two light-emitting control units EU, one of them is coupled between the high power source HP and the first thin-film transistor TFT1 (or the switch component) of the driving unit DU, the other one of them is coupled between the light-emitting unit LU1 and the first thin-film transistor TFT1 (or the switch component) of the driving unit DU, and the light-emitting control units EU can be used for helping light-emitting unit LU1 to generate light more stable. Each light-emitting control unit EU may include a thin-film transistor or switch component.

Figure 11:
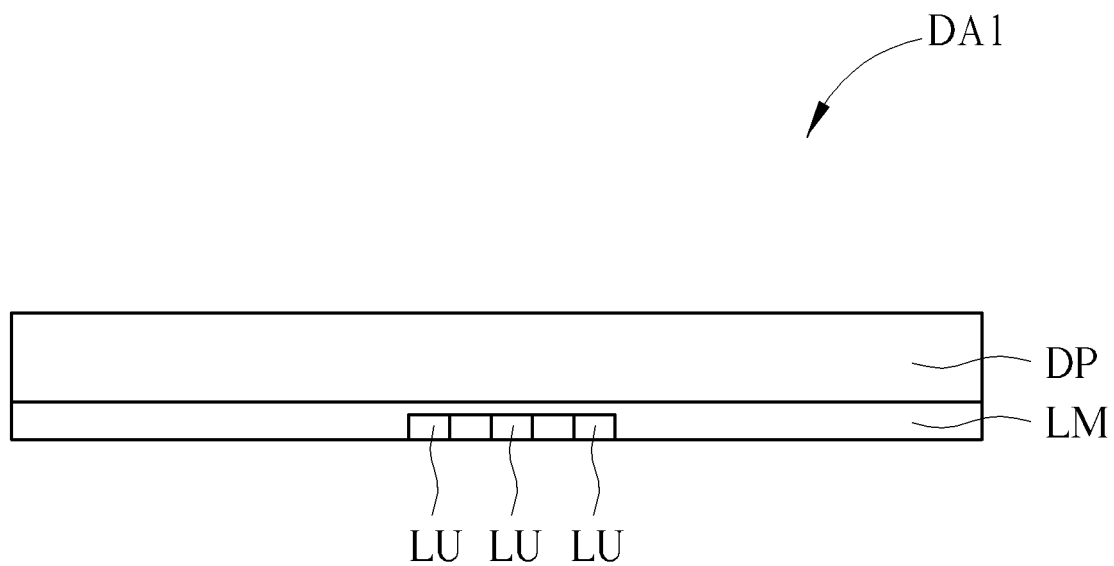
FIG. 11 schematically illustrates an electronic device according to a seventh embodiment of the present disclosure.

The electronic device of the present disclosure may be further applied to a display device. Refer to FIG. 11 which schematically illustrates an electronic device according to a seventh embodiment of the present disclosure. As shown in FIG. 11, the electronic device DA1 of this embodiment may include a light-emitting module LM including a plurality of light-emitting units LU and a display panel DP, and the light-emitting module LM is disposed on a back surface of the display panel DP, so that the display panel DP is disposed opposite to the light-emitting units LU. The display panel DP may be non-self-luminous display panel, so the light-emitting units LU are regarded as backlight source of the display panel DP, and light generated from the light-emitting module LM can enter the display panel DP from the back surface. The light-emitting units LU of this embodiment may adopt the electronic device of any one of the aforementioned embodiments.

Figure 12:
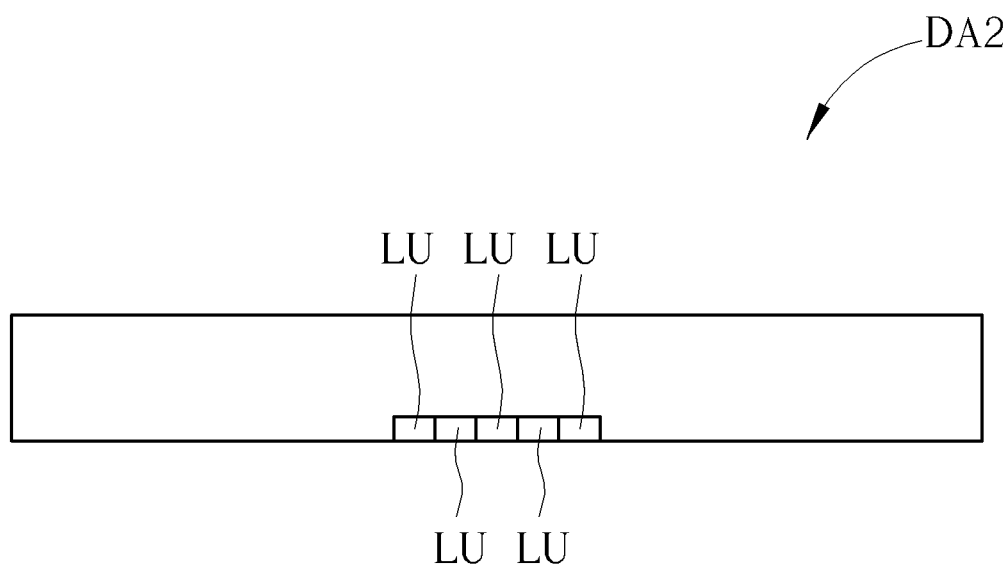
FIG. 12 schematically illustrates an electronic device according to an eighth embodiment of the present disclosure.

Refer to FIG. 12 which schematically illustrates an electronic device according to an eighth embodiment of the present disclosure. As shown in FIG. 12, the electronic device DA2 of this embodiment may include a plurality of light-emitting units LU, in which the electronic device DA2 may be a display panel, and each light-emitting unit LU may serve as a pixel or a sub-pixel of the electronic device DA2. The light-emitting units LU of this embodiment may adopt the electronic device of any one of the aforementioned embodiments.

As the mentioned above, because of the design of the light-emitting diodes with smaller size that are coupled in series, the electronic device of the present disclosure can have higher power conversion efficiency and higher proportion of power, and the lifetime of the thin-film transistor or the switch component in the driving unit can be effectively increased. Besides, since the used light-emitting diodes have smaller size, the light-emitting unit can generate light with higher brightness.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a light-emitting module, comprising:
    a light-emitting unit having a first end, the light-emitting unit comprising a first diode and a second diode coupled in series, wherein at least one of the first diode and the second diode is an inorganic light-emitting diode for generating light;
    a data line; and
    a first circuit unit comprising:
        a first thin-film transistor and a first light-emitting control unit, wherein the first thin-film transistor is coupled to the first end of the light-emitting unit and a power source, wherein the first light-emitting control unit is directly connected to the data line, the first thin-film transistor, and the power source;
        a second thin-film transistor, one of a source and a drain of the second thin-film transistor is coupled to a gate of the first thin-film transistor;
        wherein the other one of the source and the drain of the second thin-film transistor is coupled to the data line, and a gate of the second thin-film transistor is coupled to a scan line;
        a second light-emitting control unit coupled to the first thin-film transistor and the light emitting unit, and the second light-emitting control unit is directly connected to the data line; and
    a non-self-luminous display panel disposed on the light-emitting module, wherein the light-emitting unit of the light-emitting module faces the non-self-luminous display panel, and light generated from the light-emitting unit of the light-emitting module is capable of entering the non-self-luminous display panel from a back surface of the non-self-luminous display panel.

2. The electronic device according to claim 1, wherein the first thin-film transistor comprises an active layer, a material of the active layer comprises one of low-temperature polysilicon semiconductor, amorphous semiconductor and metal oxide semiconductor.

3. The electronic device according to claim 1, wherein the electronic device further comprises a second circuit unit, the first circuit unit and the second circuit unit are coupled in parallel, and the second circuit unit is coupled to the first end of the light-emitting unit and the power source.

4. The electronic device according to claim 1, wherein each of the first diode and the second diode comprises a p-type semiconductor layer, a light-emitting layer and an n-type semiconductor layer.

5. The electronic device according to claim 1, wherein the first diode and the second diode are disposed in a first package.

6. The electronic device according to claim 5, wherein the first package comprises a first base substrate, and the first diode and the second diode are disposed on the first base substrate.

7. The electronic device according to claim 1, wherein the first diode is disposed in a first package, and the second diode is disposed in a second package.

8. The electronic device according to claim 1, wherein the light-emitting unit further comprises a third diode, the first diode, the second diode and the third diode are coupled in series, the first diode and the second diode are disposed in a first package, and the third diode is disposed in a second package.

9. The electronic device according to claim 1, wherein the light-emitting unit further comprises a second end coupled to a low power source, and the power source is a high power source.

10. The electronic device according to claim 9, wherein the first circuit unit further comprises a capacitor coupled to a gate and a drain of the first thin-film transistor.

11. The electronic device according to claim 1, wherein the light-emitting unit further comprises a second end coupled to a high power source, and the power source is a low power source.

12. The electronic device according to claim 11, wherein the first circuit unit further comprises a capacitor coupled to a gate and a source of the first thin-film transistor.

\* \* \* \* \*